United States Patent [19]

Ducreuz

[11] Patent Number: 5,032,534
[45] Date of Patent: Jul. 16, 1991

[54] PROCESS FOR MANUFACTURING A REGULATION AND PROTECTION DIODE

[75] Inventor: Gérard Ducreuz, Aix en Provence, France

[73] Assignee: SGS-Thomson Microelectronics S.A., Gentilly, France

[21] Appl. No.: 404,388

[22] Filed: Sep. 8, 1989

[30] Foreign Application Priority Data

Sep. 9, 1988 [FR] France .................. 88 12346

[51] Int. Cl.$^5$ ........................... H01L 21/265
[52] U.S. Cl. ........................ 437/27; 437/904; 148/DIG. 174
[58] Field of Search .................. 437/27, 904; 148/DIG. 174

[56] References Cited

U.S. PATENT DOCUMENTS

| | | | |
|---|---|---|---|
| 4,118,251 | 10/1978 | Murrmann et al. | 437/27 |
| 4,177,095 | 12/1979 | Nelson . | |
| 4,717,678 | 1/1988 | Goth | 437/27 |
| 4,771,011 | 9/1988 | Hemmah et al. | 437/904 |

FOREIGN PATENT DOCUMENTS

| | | | |
|---|---|---|---|
| 3151437 A1 | 7/1983 | Fed. Rep. of Germany . | |
| 156373 | 12/1980 | Japan | 437/27 |
| 2130792 A | 6/1984 | United Kingdom . | |

Primary Examiner—Brian E. Hearn
Assistant Examiner—Laura M. Holtzman
Attorney, Agent, or Firm—Lowe, Price, LeBlanc and Becker

[57] ABSTRACT

A process for manufacturing a combination and protection diode on a substrate comprising a first, highly doped, thick N-type layer (40) and a second N-type, low doped, layer (10), comprises the following successive steps: implanting in a small surface area N-type dopants (12), carrying out a first annealing process, implanting in a second area including and surrounding the first area N-type dopants (22), carrying out a second annealing process, inplanting in a third area including the first area and at least one portion of the second area P-type dopants (32), and carrying out a third annealing process.

5 Claims, 3 Drawing Sheets

PROCESS FOR MANUFACTURING A REGULATION AND PROTECTION DIODE

BACKGROUND OF THE INVENTION

The invention relates to the field of regulation diodes, and more particularly to the diodes ensuring a regulation and a protection function.

A regulation diode is designed to operate in a low power range, for example about one watt, with currents of a few milliamperes and determined breakdown voltages usually ranging from 2 to 200 volts. Such a reverse biased diode operates in the avalanche mode (zener or avalanche effect according to the voltage) with a dynamic resistance as low as possible, that is, the current-voltage characteristic of this diode has to present a marked knee and the voltage has then to remain substantially constant when the current increases.

An exemplary conventional regulation diode is shown in FIG. 1. This diode is formed on a substrate comprising an N-type highly doped layer 1 (N++) on which is formed a still highly doped N-type layer 2 (N+), with a doping level chosen as a function of the desired regulation voltage. From the upper surface of this substrate is formed a P-type layer 3. The window surface from which is formed layer 3 is reduced and calculated as a function of the current density to be obtained during the regulation mode. Usually, the junction between layer 3 and layer 2 is surrounded by a guard ring 4 made of a region of the same conductivity type as layer 3 but having a lower doping at the interface between this layer and the N+ region. This guard ring is designed to ensure the proper operation of the desired zener or avalanche phenomenon while avoiding the problems inherent to the junction curvature at the periphery. Then, the upper surface is coated with a metallization 5 as well as the lower surface (not shown).

In such a zener diode, the avalanche or regulation voltage is mainly determined by the doping level of the N+-type layer 2 and only at the second order by the gradient of the PN junction and the specific shape of this junction (planar or rounded up junction). Thus, when it is desirable to obtain regulation diodes corresponding to different voltages, doping levels 2 of various levels are chosen. For example, for a 3-volt regulation voltage, the resistivity of the N+-type layer 2 will be about 6 milliohms.cm (about $10^{19}$ atoms/cm$^3$); for a 51-volt regulation voltage, this resistivity will be 300 milliohms.cm; and for a 200-volt regulation voltage, this value will be 2.5 ohms.cm (about $2 \times 10^{15}$ atoms/cm$^3$).

On the other hand, a zener diode structure such as the one illustrated in FIG. 1 is fragile when current pulses having a value of several amperes are applied because the current density in the active area (interface between layers 3 and 2) becomes too high and heating becomes important.

Clipping protection diodes are also manufactured, the purpose of which is to withstand very high instantaneous overcurrents or overvoltages while bearing reverse overcurrent of several amperes. For that purpose, it is desirable to enhance the thermal dispersion by distributing the heating on the largest possible surface. One will then obtain, unlike regulation diodes, large surface junctions.

It has been proposed in the prior art to combine the regulation and protection functions by associating a low surface regulation diode with a larger surface protection diode operating at a threshold slightly higher than that of the regulation diode, the latter diode relaying the former one when an overvoltage occurs.

An exemplary conventional diode is illustrated in FIG. 2. In this figure, the same reference numerals designate the same elements as in FIG. 1. In addition to the junctions already represented in FIG. 1, there is provided a P-type area 6 having a relatively large surface surrounding the area of the regulation diode 3 and positioned between this diode and the guard ring 4 (in some implementations, no guard ring is provided). J1 designates the regulation junction between the diffused area 3 and the N+-type layer 2, and J2 designates the protection junction between the diffused area 6 and this layer 2.

The manufacturing of such a structure involves numerous technological problems since it is mandatory to set in a reproducible way the avalanche voltages V1 and V2 associated with the two junctions J1 and J2. In fact, it is necessary to carefully set voltage V1 corresponding to junction J1 for determining the desired regulation voltage. Then, in order to obtain a satisfactory protection performance, it is necessary to set in a predetermined way the difference in voltage V2−V1 which defines the protection performance.

Conventionally, a structure such as the one of FIG. 2 is made from an N+-type substrate corresponding to the chosen doping level for layer 2 and the rear surface is more highly doped for forming the N++-type layer 1 designed to reduce the diode resistivity and to improve the ohmic contact on its rear surface. Then, the junctions J1 and J2 are formed for example by diffusing in a first step the protection ring 6 from a solid doping source. The protection ring voltage is determined at the first order by the annealing time duration. A diffusion of the central junction 3 is then carried out also from a solid source.

The realization of the guard ring, which is carried out in a conventional way, has not been described hereinabove.

Of course, according to the technologies, diffusion processes other than the one resulting from a solid dopant source diffusion are also liable to be used, for example gaseous diffusions, or implantations followed by annealing processes.

Those technologies present various drawbacks and limitations, among which:

1) Since the doping level of the N-type layer 2 determines at the first order the regulation voltage, the manufacturer who desires to supply a full range of diodes corresponding to different regulation voltages will have to keep on the shelf silicon in a large resistivity range, each resistivity corresponding to a desired regulation voltage, which involves important stocking problems.

2) On a given silicon wafer, there is a resistivity dispersion that is liable to amount to 20% (ingot striation) which may entail a dispersion of the regulation voltages up to 10%. As a result, sorting out by the manufacturer causes a manufacturing output drop.

3) Further to the choice of the regulation voltage, for determining the protection voltage, it is necessary to choose the diffusion time duration of the corresponding P-type layer (layer 6). This is empirically carried out by previously establishing a table of the diffusion time durations, a protection voltage corresponding to each time duration. With such a process it is difficult to choose a properly determined difference between the protection and regulation voltages. In other words, for each resistivity value of layer 2, it is necessary to select the diffusion time durations of the areas corresponding to the regulation junction and protection junction, which is a complex technological operation.

SUMMARY OF THE INVENTION

Thus, an object of the invention is to provide for a process for manufacturing regulation and protection diodes anoiding the above-mentioned drawbacks, and more particularly:

to use the same type of substrates, to get rid of possible resistivity dispersions of the substrate, to obtain a predetermined difference between the regulation and protection voltages.

To attain those objects and others, the invention provides for a process for manufacturing a regulation and protection diode on a substrate comprising a first thick N-type, highly doped, layer and a second N-type, low doped, layer, comprising the steps consisting of: implanting on a first small surface area N-type dopants in the second layer, carrying out a first annealing process, implanting on a second area including and surrounding the first area N-type dopants, carrying out a second annealing, implanting on a third area including the first area and at least one portion of the second area a P-type dopant, carrying out a third annealing, and forming electrodes on a portion of the third area and on the opposite surface of the substrate.

BRIEF DISCLOSURE OF THE DRAWINGS

The foregoing and other objects, features and advantages of the invention will be apparent from the following detailed description of preferred embodiments as illustrated in the accompanying drawings wherein:

FIGS. 1 and 2 respectively show a conventional regulation diode and a conventional regulation and protection diode which have been hereinabove described;

In those various figures, it will be noted that the lateral thicknesses and sizes of the layers are not drawn to scale but, as conventional in the field of the semiconductive structure representation, that the various sizes are arbitrarily chosen for the sake of legibility of the figures. Similarly, in the representation of the various diffusions, the lateral diffusions have not been taken into account and the corners are shown as right angles whereas they usually are substantially rounded up, as this will be clear to those skilled in the art.

DETAILED DESCRIPTION OF THE INVENTION

Figure 3A:
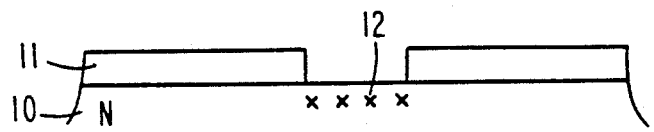
FIGS. 3A–3F show the successive manufacturing steps of a protection and regulation diode according to the invention.

FIG. 3A illustrates a first manufacturing step of a regulation and protection diode according to the invention. This diode is made on a low doped N-type layer 10, in turn formed on a substrate of the same conductivity type but with a higher doping level as this will be shown in FIG. 3F. A window is open in the mask layer 11 and an N-type implantation 12 is formed in the layer 10. The window corresponds to the regulation junction surface that is to be formed.

Figure 3B:
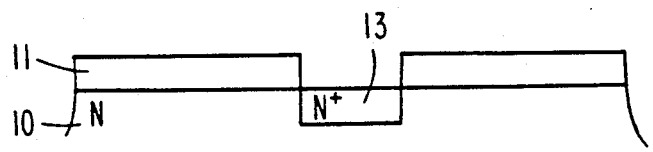

During a second step, illustrated in FIG. 3B, an annealing process is carried out, whereby an N$^+$-type area 13 is formed in layer 10.

Figure 3C:
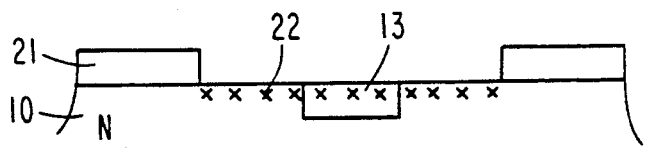

FIG. 3C shows a second mask layer 21 wherein a window is formed, the size of which corresponds to the surface of the protection diode to be carried out. An implantation 22 delineated by this window is formed in layer 10 and region 13.

Figure 3D:
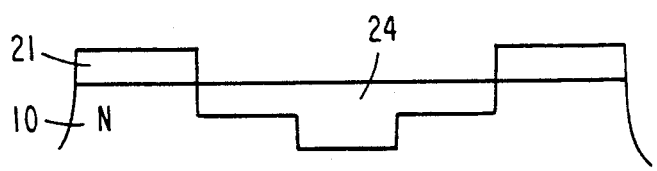

FIG. 3D shows the structure after a second annealing process. Thus, a region 24 is formed in the window delineated by the mask layer 21, this diffused region 24 being deeper at the position having received the two successive implantations.

Figure 3E:
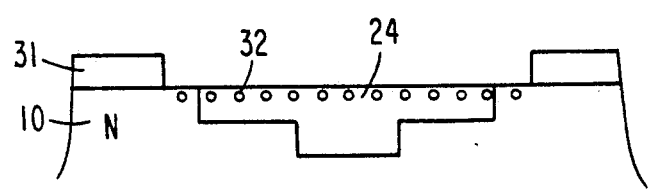

At the step illustrated in FIG. 3E, a new mask 31 is formed for delineating a P-type dopant implantation 32 concentrated enough for inverting the conductivity type in all the regions where this implantation is formed, that is, both in substrate 10 and in region 24.

Figure 3F:
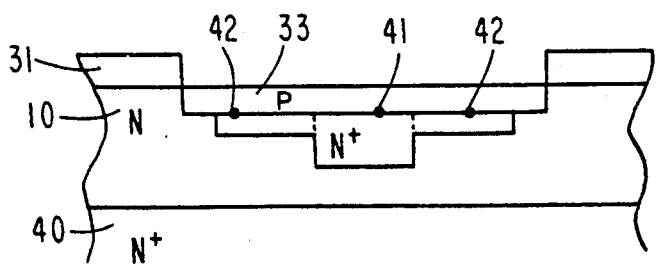

Then, an annealing process is carried out for forming the structure illustrated in FIG. 3F. FIG. 3F shows that the layer 10 is formed at the surface of an N$^+$-type substrate 40, this layer 10 resulting for example from an epitaxial growth.

Although not shown, electrodes are then formed on a portion of P-type layer 33 and on the opposite side of the substrate.

Figure 4:
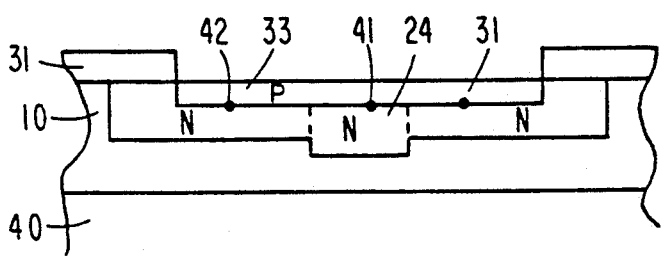
FIG. 4 shows a variant of the regulation and protection diode according to the invention.

FIG. 4 shows an alternative embodiment of the transistor of FIG. 3F. In this implementation, the mask corresponding to the second implantation (N-type) is larger than the mask corresponding to the third implantation (P-type). According to the results to be reached, those skilled in the art will choose one of those two structures.

In the structures according to the invention (FIGS. 3 and 4), the P-type layer 33 resulting from implantation 32 therefore forms a first junction J1 in an area 41 with the N-type region resulting from a double implantation (this junction corresponds to the regulation diode) and a second junction J2 in an area 42 with the N-type region which has received one implantation only (this junction corresponds to the protection diode).

Thus, the regulation and protection voltages will depend upon the successive implantations carried out and not (or very little) upon the doping level of the initial layer 10 and the possible resistivity dispersions of this layer.

The invention therefore resolves the first two abovementioned drawbacks of the prior art structures (necessity of providing multiple substrates and problems inherent to the substrate dispersion).

It will now be explained, in relation with FIGS. 5 and 6, how the third drawback of the prior art (difficulty in setting an accurate and constant difference between the regulation and protection voltages) is avoided by the invention.

Figure 1:
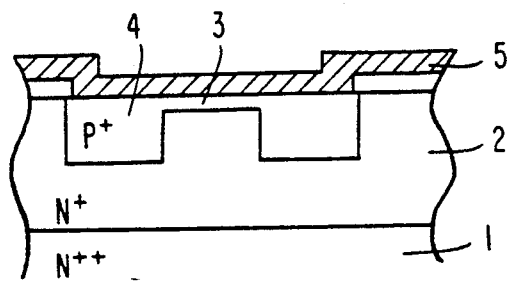
Figure 2:
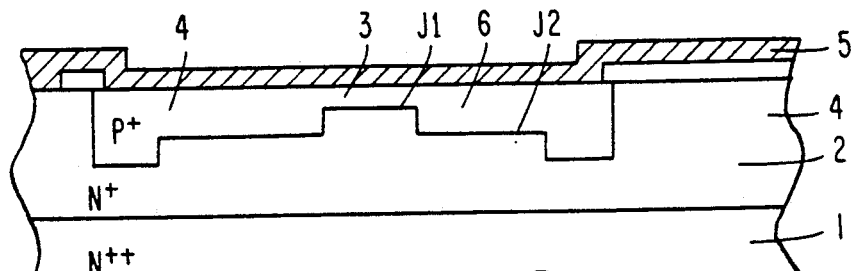
Figure 5:
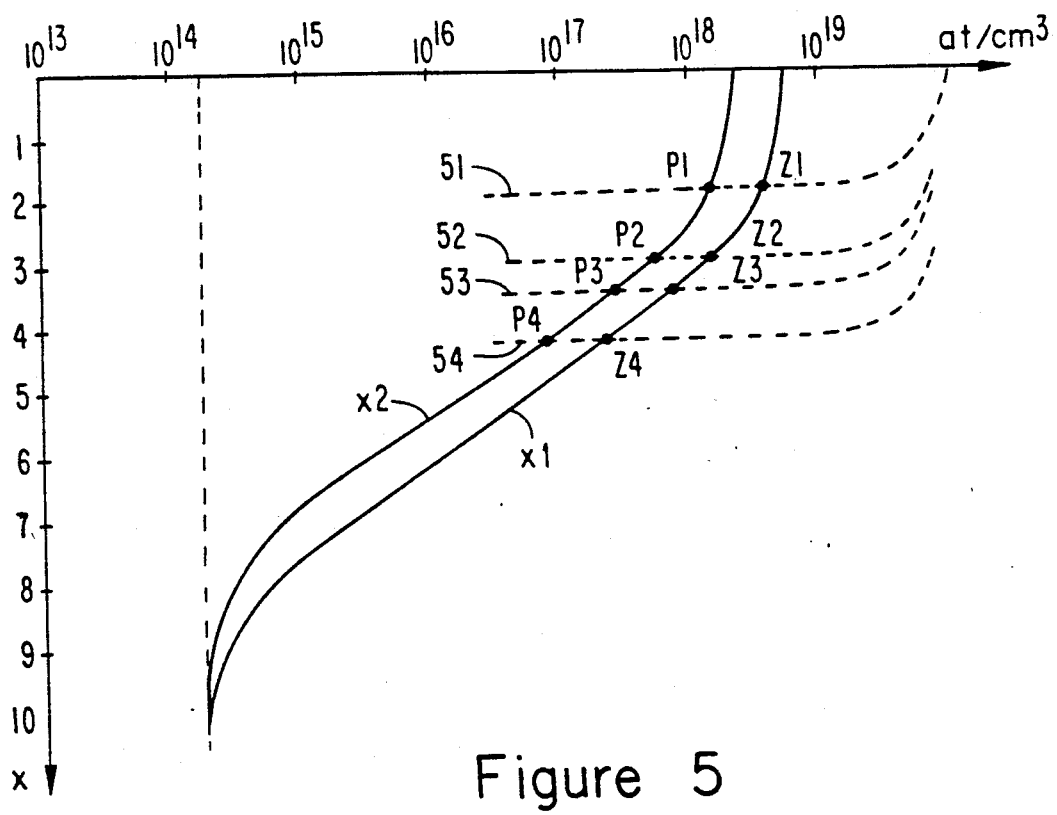
FIGS. 5 and 6 show the curves of dopant concentration defined in atoms/cm$^3$ as a function of the penetration depth, x, in micrometers.

FIG. 5 shows curves indicating the concentration of carriers introduced in layer 10 as a function of depth, x, in this layer measured from the surface. In this example, one considers a layer 10 in silicon of crystallographic orientation (111) and N-type doped with phosphorus at a concentration of $2 \times 10^{14}$ atoms/cm$^3$. The N-type implantations are two identical implantations carried out under an energy of 80 keV and a density of $6 \times 10^{14}$ atoms/cm$^2$. After the first implantation, one has proceeded to an annealing for one hour at 1,180° C. and, after the second implantation, to an annealing for 4 hours at 1,180° C. Thus, diffusion profiles such as shown by the curves $x_1$ and $x_2$ have been obtained, which respectively correspond to the regulation diode region (or zener diode) and to the protection diode region.

One major characteristic of those curves $x_1$ and $x_2$ lies in the fact that they are substantially parallel over an important range.

On the other hand, in FIG. 5, the curves in dotted lines 51-54 correspond to the penetration depth of the P-type layer 33 as a function of the subjacent doping level N, for various values of annealing time duration. Thus, curve 51 corresponds to the case a $P^+$-type implantation (for example bore atoms) has been followed by a one-hour annealing process at 1,050° C., curve 52 to the case of a three-hour annealing process at 1,050° C., curve 53 to the case of a five-hour annealing process at 1,050° C. and curve 54 to the case of a one-hour annealing process at 1,150° C. (the diffusion annealing process of the P-type dopants being carried out at a substantially lower temperature than that of the first diffusion annealing processes of the N-type dopants, it only has a slight influence on the redistribution of the N-type dopants).

Z1, P1 designate the intersections of the curves $x_1$ and $x_2$ with curve 51 ... and Z4, P4 designate the intersections of curves $x_1$ and $x_2$ with curve 54. Those intersection points indicate the concentration of N-type dopants at the junctions from which the regulation and protection voltages can be calculated.

Table 1 given hereinunder indicates the values of the avalanche voltages corresponding to each of these points Z1-Z4 and P1-P4, and the percentage value in brackets indicates the difference between those voltages for homologous points.

TABLE 1

| Z1 | 7.5 V | P1 | 9 V | (20%) |
|----|-------|----|-----|-------|
| Z2 | 9 V | P2 | 10.7 V | (18%) |
| Z3 | 10 V | P3 | 11.8 V | (18%) |
| Z4 | 11.5 V | P4 | 17 V | (40%) |

It can be seen that, for the intersections with curves 51-53, there is a substantially constant percentage difference between the avalanche voltages of the regulation and protection junctions, which is the purpose of the invention. Therefore, it is possible, for N-type implantations and predetermined annealing processes, and as a function of the diffusion time duration of the P-type implantation, to connect a series of diodes corresponding to the values of the chosen regulation voltages, the protection voltage being automatically adapted to this regulation value. If the regulation voltage of a batch of diodes proves to be lower than the desired value, it will be possible to carry out an additional annealing process for increasing the regulation voltage without impairing the relation between the regulation voltage and protection voltage.

Figure 6:
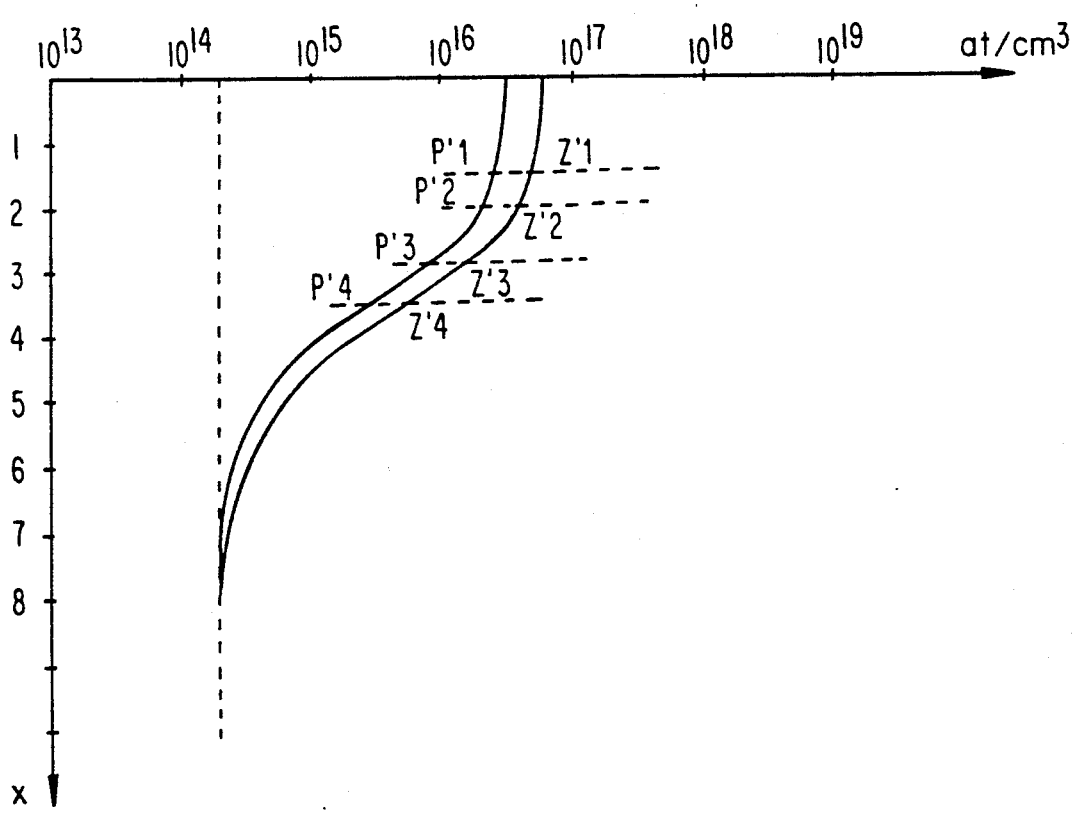

FIG. 6 shows curves analogous to those of FIG. 5 for another selection of $N^+$-type implantations and the corresponding annealing processes. In case of FIG. 6, the same substrate as in FIG. 5 is used. The phosphorous implantations are carried out under 80 keV with a density of $6 \times 10^{12}$ atoms/cm$^2$. The annealing time durations are identical (one hour and four hours). Table 2 hereinunder indicates, similarly to table 1 given in relation with FIG. 5, that it is possible to reach avalanche voltages for the regulation diode ranging from 30 to 73 volts with the avalanche voltages of the protection diode varying by about 30% from those values.

TABLE 2

| Z'1 | 30 V | P'1 | 38 V | (27%) |
|-----|------|-----|------|-------|
| Z'2 | 36 V | P'2 | 48 V | (33%) |
| Z'3 | 47 V | P'3 | 63 V | (34%) |
| Z'4 | 73 V | P'4 | 100 V | (37%) |

Thus, it has been determined that, for obtaining regulation voltages ranging from 7.5 to 75 V, five initial implantation selections are sufficient. From 7 to 9 V, it will be possible to choose implantation values of $6 \times 10^{14}$ atoms/cm$^2$; from 9 to 14 V, $10^{14}$ atoms/cm$^2$; from 14 to 18 V, $6 \times 10^{13}$ atoms/cm$^2$; from 19 to 28 V, $2 \times 10^{13}$ atoms/cm$^2$ and from 28 to 75 V, $6 \times 10^{12}$ atoms/cm$^2$; all the other conditions being those indicated in the above examples.

Of course, the invention is liable of numerous variants which will clearly appear to those skilled in the art. Especially, the improvements conventionally brought to the regulation and protection diodes can be implemented: implantation and annealing modes, lateral isolation or guard rings, contacting modes.

I claim:

1. A process for the manufacturing of a regulation and protection diode on a substrate comprising a first thick and highly doped N-type layer and a second low doped N-type layer, comprising the following successive steps of:
    implanting in a first small surface area N-type dopants in the second layer of said substrate,
    carrying out a first annealing process,
    implanting in a second area including and surrounding the first area N-type dopants,
    carrying out a second annealing process,
    implanting in a third area including the first area and at least one portion of the second area P-type dopants,
    carrying out a third annealing process, and
    forming electrodes on a portion of the third area and on the opposite surface of the substrate,
wherein the first and second N-type implantation steps are carried out with the same implantation doses.

2. A process for manufacturing a regulation and protection diode on a substrate comprising a first thick and highly doped N-type layer and a second low doped N-type layer, comprising the following successive steps of:
    implanting in a first small surface area N-type dopants in the second layer of said substrate,
    carrying out a first annealing process,
    implanting in a second area including and surrounding the first area N-type dopants,
    carrying out a second annealing process,
    implanting in a third area including the first area and at least one portion of the second area P-type dopants,
    carrying out a third annealing process,
    forming electrodes on a portion of the third area and on the opposite surface of the substrate,
    measuring the regulation voltage, and
    continuing the third annealing process if said regulation voltage is lower than a desired value, whereby the difference between the regulation voltage and the protection voltage remains constant.

3. A process for manufacturing a regulation and protection diode according to claim 2, wherein the first and second N-type implantation steps are carried out with the same implantation doses.

4. A process for manufacturing a regulation and protection diode on a substrate, wherein the substrate comprises a thick highly doped N-type first layer and a low doped N-type second layer, the method comprising the successive steps of:

implanting N-type dopants in a first small surface area of the second layer to a first depth in the substrate,
    carrying out an annealing,
    implanting N-type dopants in a second surface area surrounding and including the first surface area to a second depth in the substrate less than said first depth in the substrate,
    carrying out an annealing,
    implanting P-type dopants in a third surface area including the small surface area and at least a portion of the surrounding second surface area to a third depth in the substrate less than the second depth in the substrate, and
    carrying out another annealing after the implantation of the P-type dopants.

5. A process for manufacturing a regulation and protection diode as in claim 4 further comprising the step of forming electrodes on a portion of the third surface area and on the opposite side of the substrate after said another annealing.

* * * * *

UNITED STATES PATENT AND TRADEMARK OFFICE
CERTIFICATE OF CORRECTION

PATENT NO. : 5,032,534

DATED : July 16, 1991

INVENTOR(S) : Gerard DUCREUX

It is certified that error appears in the above-identified patent and that said Letters Patent is hereby corrected as shown below:

On the title page, item [75] Inventor: correct the inventor's name as follows:

--Gerard Ducreux--.

Item [19] change "Ducreuz" to read --Ducreux--.

Signed and Sealed this

Fourth Day of May, 1993

Attest:

MICHAEL K. KIRK

Attesting Officer

Acting Commissioner of Patents and Trademarks